(12) United States Patent
Petersson et al.

(10) Patent No.: US 10,210,290 B1
(45) Date of Patent: Feb. 19, 2019

(54) SYSTEMS AND METHODS FOR PROVIDING FIELD TUNING SIMULATION OF A PHYSICAL SYSTEM

(71) Applicant: Ansys, Inc., Canonsburg, PA (US)

(72) Inventors: Lars Eric Rickard Petersson, Wexford, PA (US); Jason Kurtz, Bethel Park, PA (US)

(73) Assignee: Ansys, Inc., Canonsburg, PA (US)

( * ) Notice: Subject to any disclaimer, the term of this patent is extended or adjusted under 35 U.S.C. 154(b) by 195 days.

(21) Appl. No.: 15/066,169

(22) Filed: Mar. 10, 2016

Related U.S. Application Data

(60) Provisional application No. 62/131,298, filed on Mar. 11, 2015.

(51) Int. Cl.
    G06F 17/50    (2006.01)
    G06F 17/13    (2006.01)
(52) U.S. Cl.
    CPC .......... G06F 17/5009 (2013.01); G06F 17/13 (2013.01)
(58) Field of Classification Search
    USPC .............. 703/2, 19; 324/333, 339; 435/6.19
    See application file for complete search history.

(56) References Cited

U.S. PATENT DOCUMENTS

| | | | | |
|---|---|---|---|---|
| 8,538,699 | B2 * | 9/2013 | Jing | G01V 3/12 324/333 |
| 2006/0293597 | A1 * | 12/2006 | Johnson | A61B 5/4312 600/437 |
| 2007/0099200 | A1 * | 5/2007 | Chow | B01L 3/50273 435/6.19 |
| 2007/0282209 | A1 * | 12/2007 | Lui | A61B 5/0261 600/485 |
| 2013/0282141 | A1 * | 10/2013 | Herr | A61F 2/5046 623/33 |
| 2014/0368201 | A1 * | 12/2014 | Leblanc | G01V 3/26 324/339 |
| 2014/0368202 | A1 * | 12/2014 | San Martin | G01V 3/26 324/339 |
| 2014/0368203 | A1 * | 12/2014 | Samson | G01V 3/28 324/339 |

* cited by examiner

*Primary Examiner* — Thai Q Phan
(74) *Attorney, Agent, or Firm* — Jones Day

(57) ABSTRACT

Systems and methods are described for providing adjustable simulation of electric and magnetic fields of a system. Data is received that is indicative one or more parameters of an object in a three dimensional space. A first system of differential equations is to determine electric and magnetic field values are stored at a plurality of points of the three dimensional space and storing electric and magnetic field values in the computational mesh data structure. A second system of differential equations is solved to determine sensitivities of the determined electric and magnetic fields to changes in a first parameter of the object at points in the three dimensional space. Updated electric and magnetic field values are determined based on a user entered adjustment, the electric and magnetic field values in the computational mesh, and the sensitivities without re-solving the first system of differential equations or the second system of differential equations.

23 Claims, 5 Drawing Sheets

SYSTEMS AND METHODS FOR PROVIDING FIELD TUNING SIMULATION OF A PHYSICAL SYSTEM

CROSS-REFERENCE TO RELATED APPLICATIONS

This application claims priority to U.S. Provisional Application No. 62/131,298, filed on Mar. 11, 2015, entitled "Systems and Methods for Providing Field Tuning Simulation of a Physical System," the entirety of which is herein incorporated by reference.

FIELD

This disclosure is related generally to physical system simulation and more particularly to efficient electric and magnetic field simulation.

BACKGROUND

The demand for simulation of physical systems of all types continues to grow, especially in areas of product development and design. Because physical production of prototypes for testing is time consuming and often expensive, simulation provides a valuable tool that streamlines research and development to narrow a set of possible solutions to a problem prior to expensive physical testing. While certain physical system simulations can provide accurate representations of a physical system, such simulations are often computationally expensive, requiring long processing runs before providing results.

SUMMARY

Systems and methods are described for providing adjustable simulation of electric and magnetic fields of a physical system. Physical system data is received that is indicative of the presence of an object at locations in a three dimensional space, where the physical system data includes one or more parameters of the object, where the physical system data is stored in a computational mesh that represents the three dimensional space, the computational mesh being stored in a data structure in a non-transitory computer-readable medium. A first system of differential equations is solved to determine electric and magnetic field values at a plurality of points of the three dimensional space, and electric and magnetic field values are stored in the computational mesh data structure. A second system of differential equations is solved to determine sensitivities of the determined electric and magnetic fields to changes in a first parameter of the object at points in the three dimensional space. A user entered adjustment to the first parameter of the object is received, and updated electric and magnetic field values are determined based on user entered adjustment, the electric and magnetic field values in the computational mesh, and the sensitivities without re-solving the first system of differential equations or the second set of differential equations.

As another example, a computer-implemented system for providing adjustable simulation of electric and magnetic fields of a computer-system includes one or more data processors. A computer-readable medium encoded with a computational mesh data structure, wherein the computational mesh data structure is configured to contain data indicative of the presence of an object at locations in a three dimensional space and solved electric and magnetic field values at a plurality of points in the three dimensional space. The computer-readable medium is further encoded with instructions for commanding the one or more data processors to execute steps. The steps include solving a first system of differential equations to determine electric and magnetic values at a plurality of points of the three dimensional space and storing the electric and magnetic field values in the computational mesh data structure. A second system of differential equations is solved to determine sensitivities of the determined electric and magnetic fields to changes in a first parameter of the object at points in the three dimensional space. Updated electric and magnetic field values are determined based on a user entered adjustment to the first parameter, the electric and magnetic field values in the computational mesh, and the sensitivities without re-solving the first system of differential equations or the second set of differential equations.

As a further example, a computer-readable medium is encoded with instructions for commanding one or more data processors to execute steps of a method for providing adjustable simulation of electric and magnetic fields of a physical system. In the steps, physical system data is received that is indicative of the presence of an object at locations in a three dimensional space, where the physical system data includes one or more parameters of the object, where the physical system data is stored in a computational mesh that represents the three dimensional space, the computational mesh being stored in a data structure in a non-transitory computer-readable medium. A first system of differential equations is solved to determine electric and magnetic field values at a plurality of points of the three dimensional space, and electric and magnetic field values are stored in the computational mesh data structure. A second system of differential equations is solved to determine sensitivities of the determined electric and magnetic fields to changes in a first parameter of the object at points in the three dimensional space. A user entered adjustment to the first parameter of the object is received, and updated electric and magnetic field values are determined based on user entered adjustment, the electric and magnetic field values in the computational mesh, and the sensitivities without re-solving the first system of differential equations or the second set of differential equations.

DETAILED DESCRIPTION

Figure 1:
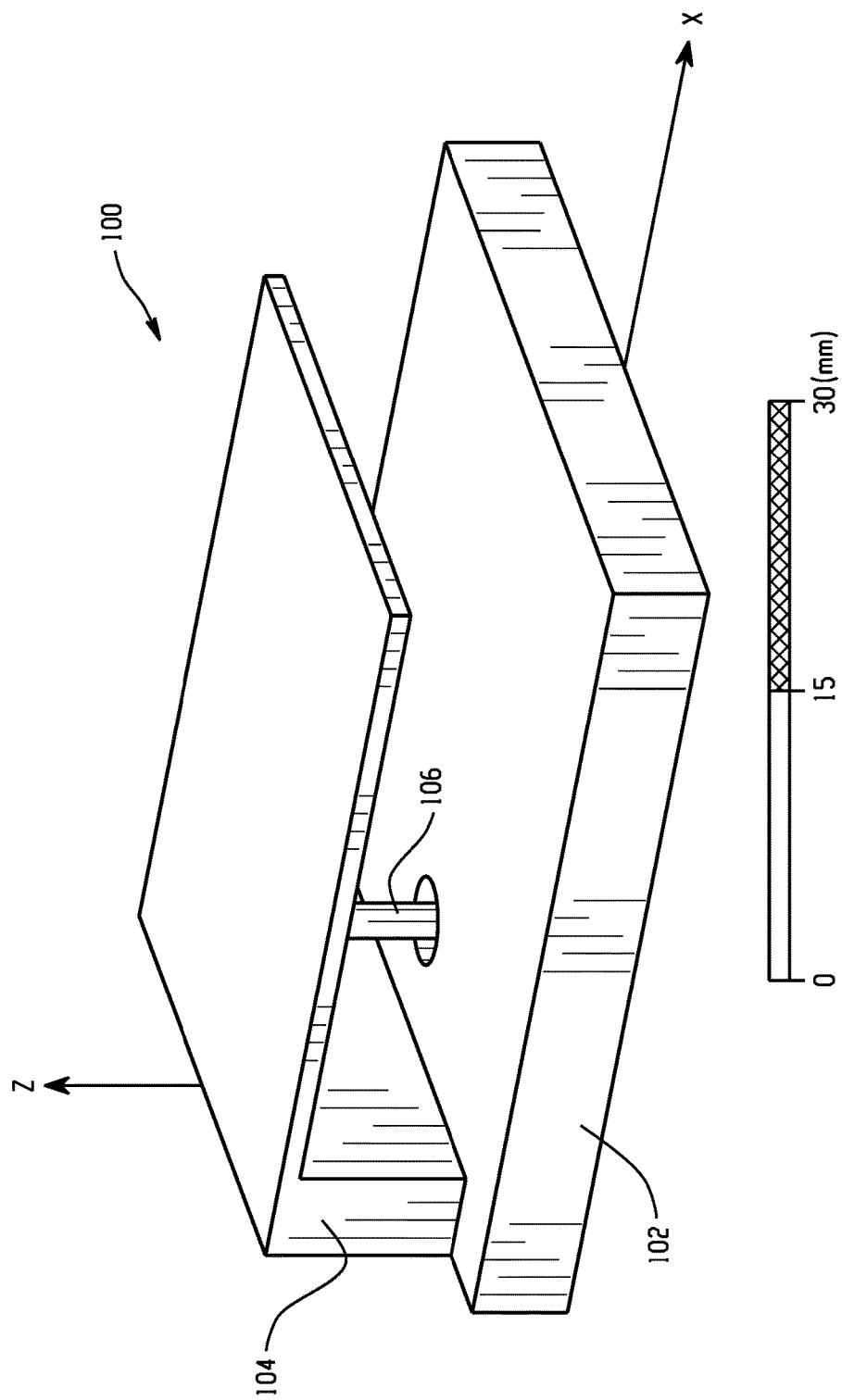
FIG. 1 is a diagram depicting an antenna positioned within a three dimensional space.

FIG. 1 is a diagram depicting an antenna positioned within a three dimensional space. The antenna 100 is designed as a component of a device, such as a consumer hand held mobile device. The antenna 100 is configured to transmit or receive electromagnetic radiation indicative of data values. The antenna includes a base portion 102, a first segment 104, and a feed (stub) 106 positioned along the x-length of the antenna 100. In designing the antenna 100, a simulation is performed to predict electromagnetic fields that may be produced by or experienced by the antenna 100 to estimate its effectiveness. In designing the antenna 100, an engineer may wish to see the effects of varying a number of parameters of the antenna 100, such as the position of the feed 106 along the x-axis of the antenna 100, height, width or thickness of the first segment 104, or a material of which the antenna 100 is made. To determine electric and magnetic field values or other metrics associated with the antenna 100 as each of those parameters are adjusted, a system of differential equations can be calculated for each configuration to solve for the desired metric values.

While such solving and re-solving of the differential equations can be effective at producing accurate simulation results, it can be computationally burdensome, taking noticeable computing time for each re-solving effort. This is especially true in the product design environment, where an engineer may wish to perform a number of adjustments (tweaks) to a variety of parameters to gauge their effects on the design in an attempt to create a best design. In such an iterative design environment, the re-solving computational time can be a significant drag on development productivity.

Figure 2:
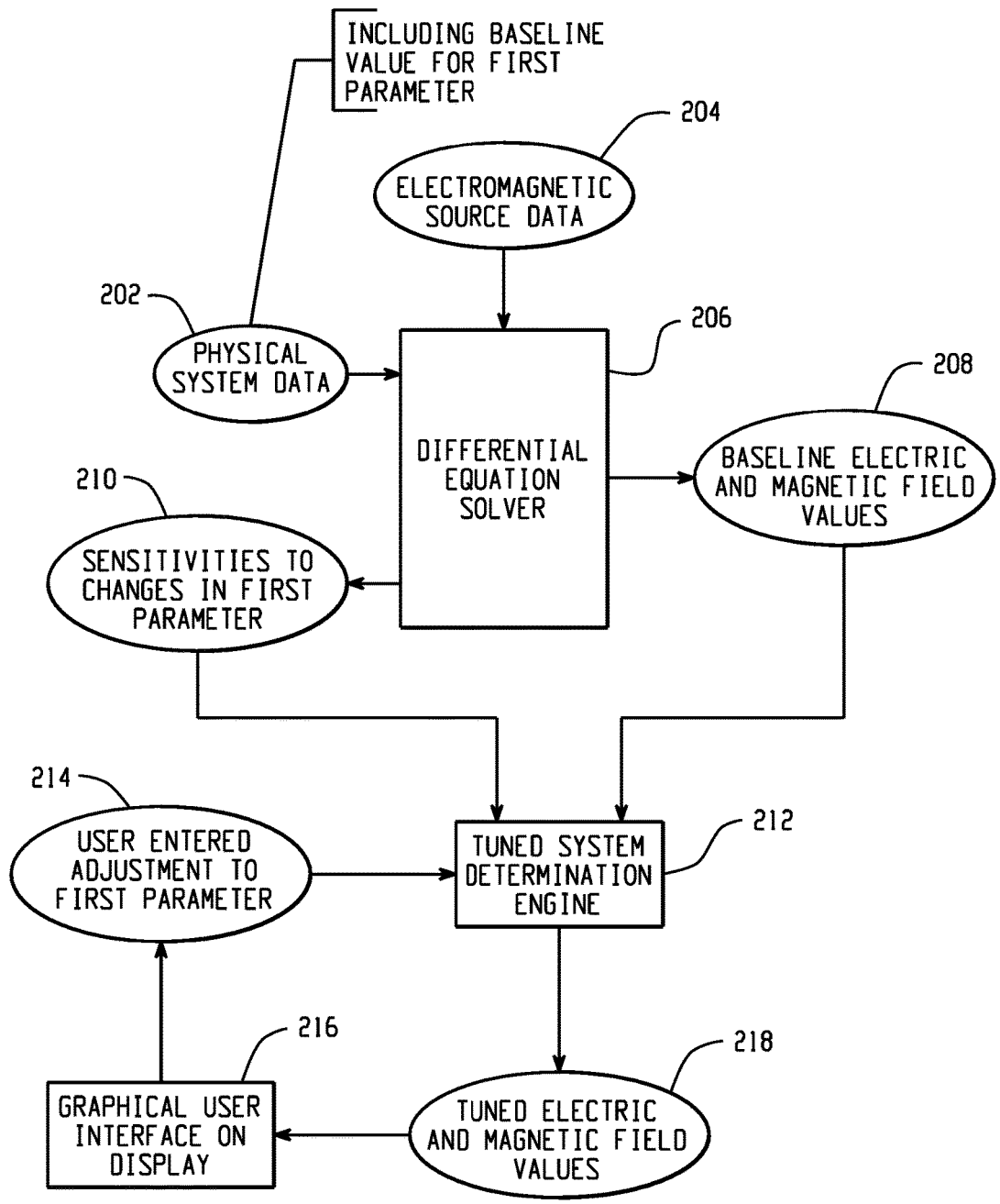
FIG. 2 is a diagram depicting a computer-implemented engine for providing an adjustable simulation of electric and magnetic fields of a physical system.

FIG. 2 is a diagram depicting a computer-implemented engine for providing an adjustable simulation of electric and magnetic fields of a physical system. The system of FIG. 2 receives physical system data 202 indicative of the presence of an object, such as the antenna depicted in FIG. 1, at locations in a three dimensional space. The physical system data 202 includes one or more parameters of the object (e.g., a position of the feed 106 of the antenna 100 of FIG. 1). The physical system data 202 is stored in a computational mesh that represents the three dimensional space, where the computational mesh is stored in a data structure in a non-transitory computer-readable medium. The physical system data 202 along with electromagnetic source data 204 (e.g., electromagnetic sources being projected to the antenna 100 from afar or from the antenna 100) are received by a differential equation solver 206. The differential equation solver 206 solves a first system of differential equations based on the inputs 202, 204 to determine baseline electric and magnetic field values 208 at a plurality of points of the three dimensional space. The solver 206 stores those baseline values 208 in the computational mesh data structure.

The differential equation solver 206 is further configured to solve a second system of differential equations to determine sensitivities 210 of the baseline electric and magnetic field values 208 to changes in a first parameter (e.g., the feed position 106 of the antenna 100 in the x-direction). Sensitivities 210 may further be calculated for additional parameters of the object (e.g., width of the first segment 104 of the antenna 100). The baseline electric and magnetic field values 208 and the sensitivities 210 are provided from the differential equation solver 206 to a tuned system determination engine 212. In one embodiment, solving the second set of differential equations can be substantially streamlined. In such an embodiment, a factorized system matrix used in solving the first system of equations is retained. Reusing the factorized system matrix computed while solving the first set of differential equations substantially reduces the computational effort necessary to solve the second set of differential equations.

The tuned system determination engine 212 is configured to receive user entered adjustments 214 to the first parameter. For example, a user may interact with a slide bar of a graphical user interface on a display 216 to adjust a value of the first parameter. The slide bar may permit iterative, modest adjustments to the first parameter (e.g., +/−10%). The tuned system determination engine 212 is configured to adjust the baseline electric and magnetic field values 208 according to the user entered adjustment to the first parameter 214 based on the determined sensitivities 210 to changes in that first parameter to determine updated electric and magnetic field values 218 for display on the graphical user interface 216. By using the determined sensitivities 210, the tuned system determination engine 212 is able to determine an approximation of the effect of the user entered adjustment 214 to the first parameter without requiring resolving of the first system of differential equations. Such a system can in some examples provide real time adjustment of the first parameter and other parameters for which sensitivities 210 have been determined, allowing simulation of a greater number of configurations in a given amount of time.

In one embodiment, a first type of field tuning is described for tuning the solution on the computational mesh. The example tuning is based on a tuning of the electric, $\vec{E}$, and magnetic, $\vec{H}$, fields on a linear approximation. For a given design variable g, with nominal value $g_0$, the tuned fields are obtained by varying the perturbation $\Delta g$, typically within ±10% of the nominal value using the following formulas:

$$\vec{E}(g_0 + \Delta g) \cong \vec{E}(g_0) + \Delta g \frac{\partial \vec{E}}{\partial g}(g_0) \tag{1}$$

$$\vec{H}(g_0 + \Delta g) \cong \vec{H}(g_0) + \Delta g \frac{\partial \vec{H}}{\partial g}(g_0) \tag{2}$$

$$\frac{\partial \vec{E}}{\partial g} \text{ and } \frac{\partial \vec{H}}{\partial g}$$

The derivatives are computed along with the solutions of $\vec{E}$ and $\vec{H}$ using an analytic differentiation of the underlying system matrix. After the nominal solution has been computed, the user can quickly obtain answers over a narrow range around the nominal values of the design variables by tuning the results using the expressions (1) and (2). Any derived scalar quantities are computed relying on the tuned fields, instead of a linear model using explicit differentiation. For example, the magnitude of electric field would be tuned using the following formula:

$$|\vec{E}(g_0 + \Delta g)| \cong \left|\vec{E}(g_0) + \Delta g \frac{\partial \vec{E}}{\partial g}(g_0)\right| \tag{3}$$

instead of $$|\vec{E}(g_0 + \Delta g)| \cong |\vec{E}(g_0)| + \Delta g \frac{\partial |\vec{E}|}{\partial g}(g_0) \tag{4}$$

In addition to providing fields on the computational mesh, an example system can produce near- and far-field plots as a function of spherical coordinates r, δ, and φ. These plots can be calculated given nominal values for any design variables. To generate near- or far-field plots:

1. A solver computes field values $\vec{E}$ and $\vec{H}$ on a closed surface, S, inside the computational domain for given design variables. The surface S encloses all radiating/scattering objects (e.g., all non-background objects).
2. A post-processor computes associated equivalent surface currents $\vec{J}=\hat{n}\times\vec{H}$ and $\vec{M}=\vec{E}\times\hat{n}$ on S.
3. The radiated near- or far-field $\vec{rE}$ is computed from a convolution integral with the free space Green's function and the equivalent currents on the closed surface S. See [1]—A. Balanis, *Advanced Engineering Electromagnetics*, John Wiley & Sons, 1989.

Because $\vec{rE}$ is a linear function of $\vec{J}$ and $\vec{M}$, the derivative of $\vec{rE}$ is computed in the same way using derivatives of $\vec{J}$ and $\vec{M}$. For a given tuning variable g, with nominal value $g_0$, the above can be extended as follows:

$$\frac{\partial \vec{E}}{\partial g} \text{ and } \frac{\partial \vec{H}}{\partial g}$$

1. The solver computes field values E and H and partial derivatives on surface S for the nominal value $g=g_0$. Note that the derivatives can be accurately and efficiently computed using analytic differentiation of underlying system matrix.
2. The post-processor computes associated equivalent surface currents $\vec{J}$ and $\vec{M}$ and partial derivatives $$\frac{\partial \vec{J}}{\partial g} = \hat{n} \times \frac{\partial \vec{H}}{\partial g} \text{ and } \frac{\partial \vec{M}}{\partial g} = \frac{\partial \vec{E}}{\partial g} \times \hat{n}$$

on the same closed surface S.
3. The equivalent surface currents are used in a convolution integral with the free space Green's function [1] to produce radiated near- or far-field data $\vec{rE}$, $\vec{rH}$ and the partial derivatives $$\frac{\partial \vec{rE}}{\partial g}, \frac{\partial \vec{rH}}{\partial g}$$

as functions of spherical coordinates r, θ and φ. The system obtains $$\frac{\partial \vec{rE}}{\partial g} \text{ and } \frac{\partial \vec{rH}}{\partial g}$$

from $$\frac{\partial \vec{J}}{\partial g}, \frac{\partial \vec{M}}{\partial g}$$

by using the same routines used to compute $\vec{rE}$, $\vec{rH}$ from $\vec{J}$ and $\vec{M}$.

4. A User selects a perturbation Δg within some small perturbation of (e.g., −10% to 10%) of nominal value $g_0$, and "tuned" near- or far-field data is computed using the linear approximations:

$$\vec{rE}(g_0+\Delta g) \cong \vec{rE}(g_0) + \Delta g \frac{\partial \vec{rE}}{\partial g}(g_0) \tag{5}$$

$$\vec{rH}(g_0+\Delta g) \cong \vec{rH}(g_0) + \Delta g \frac{\partial \vec{rH}}{\partial g}(g_0) \tag{6}$$

Derived scalar quantities are tuned using existing methods with $\vec{rE}(g_0+\Delta g)$ and $\vec{rH}(g_0+\Delta g)$ in place of $\vec{rE}$, $\vec{rH}$. This means that the derived tuned scalar quantities, in one embodiment, are not obtained using explicit differentiation, similar to what was explained above for derived scalar quantities based on the fields on the mesh.

To illustrate, the following describes an example tuning of the far field produced by the patch-antenna shown in FIG. 1. For this example, the system tunes the location of the feed position (stub) 106 based on a user entered adjustment, where the nominal position is at 10.80 mm in the x-direction. The design variable which controls the feed position has been named feed_pos and the system enables user tuning of that parameter to ±10% of the nominal position (9.72 mm and 11.88 mm).

Figure 3:
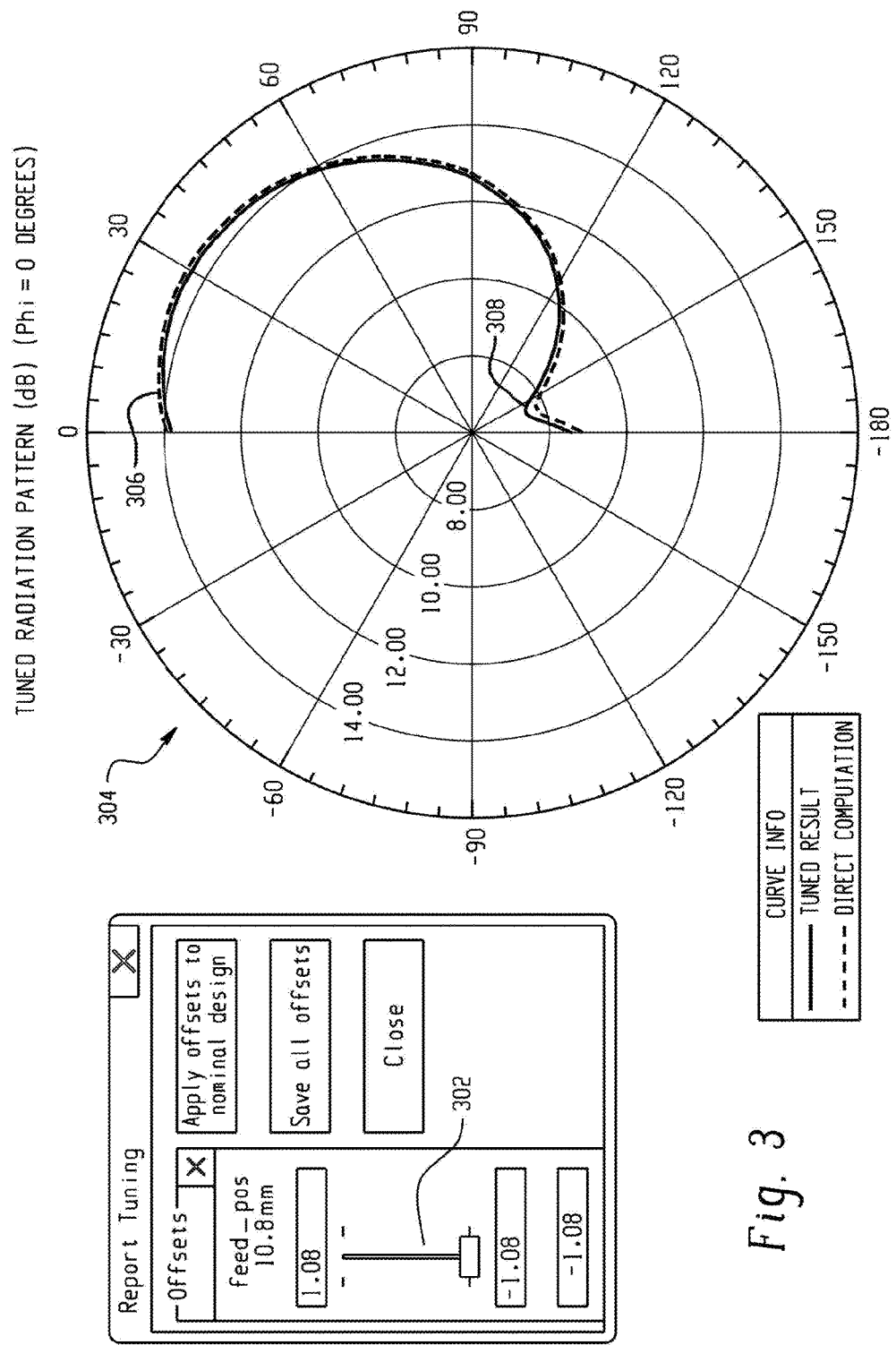
FIG. 3 is a graphical user interface that includes a slide bar user interface element for tuning the feed position parameter.

FIG. 3 is a graphical user interface that includes a slide bar user interface element 302 for tuning the feed position parameter. The slide bar enables adjustment of the feed_pos parameter from −10% of the nominal value (9.72 mm) to +10% of the nominal value (11.88 mm). A display portion 304 provides a display of a tuned radiation pattern. A first plot 306 is based on a full re-solving of the first set of differential equations based on the new feed_pos value of 9.72 mm. This is an exact solution, but its generation is computationally expensive. The second plot at 308 is generated using the methods described herein, where the radiation pattern is calculated without re-solving any of the differential equations. The second plot 308 exhibits strong agreement with the exact solution 306 while being less computation intensive. In one embodiment, multiple tuning plots 308 can be generated based on adjustments to the tuning bar 302 without having to re-solve either of the first or second sets of differential equations. The user interface of FIG. 3 enables comparison the tuned value 308 with that obtained from a standard solution 306 at that position.

Figure 4:
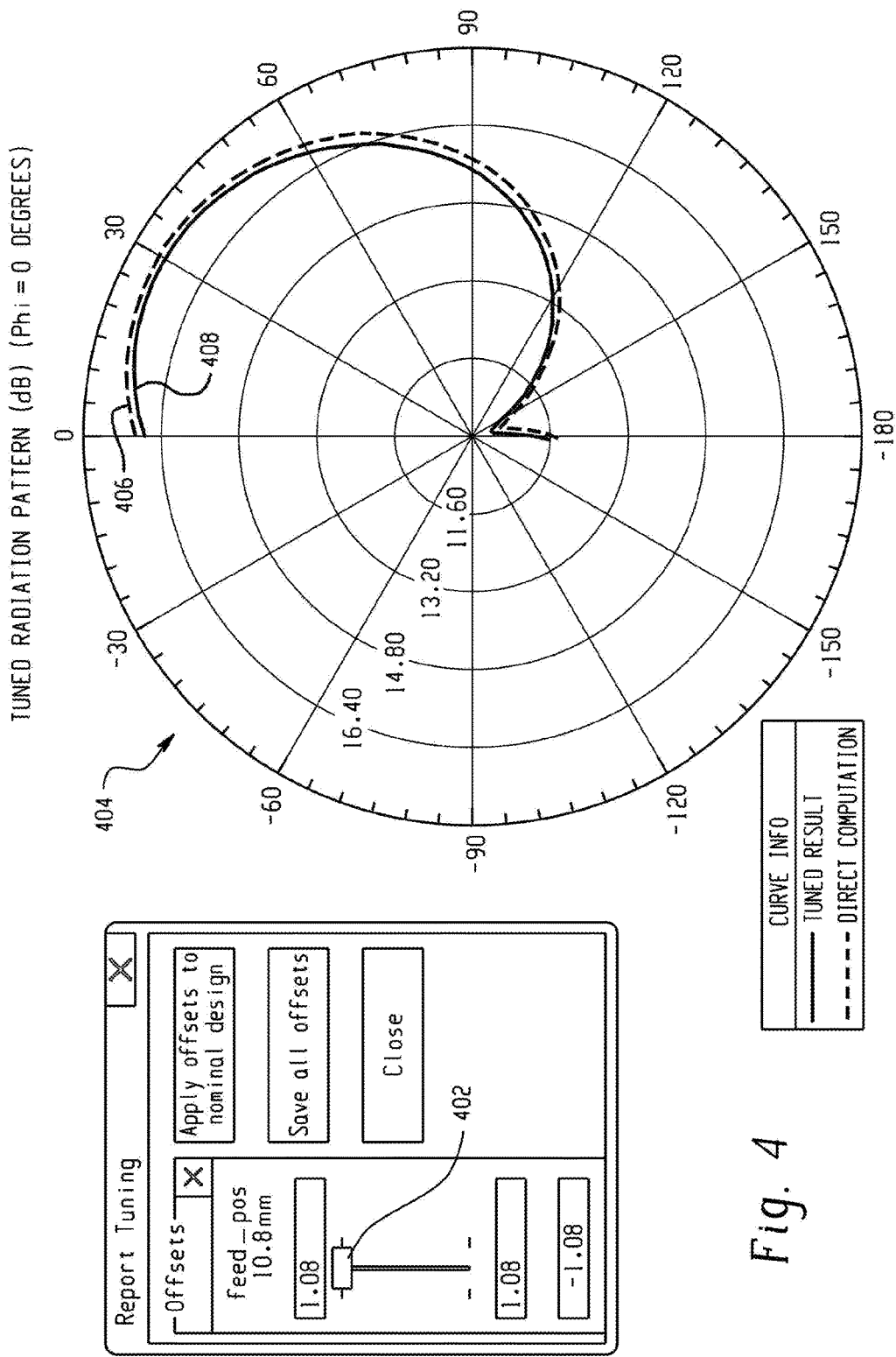
FIG. 4 depicts an adjusted graphical user interface that is based on a different selected tuning value for the feed_pos parameter.

FIG. 4 depicts an adjusted graphical user interface that is based on a different selected tuning value for the feed_pos parameter. The slide bar 402 in FIG. 4 sets the feed_pos value to 11.88 mm. The display portion 404 provides a first plot 406 that corresponds to a re-solving of the first set of differential equations, resulting in a computationally expensive exact solution. The display portion further provides a second plot 408 that displays the tuned radiation pattern that is estimated if the feed position was adjusted to 11.88 mm in the x-direction using pre-determined sensitivities without re-solving the first set of differential equations or the second set of differential equations.

Figure 5:
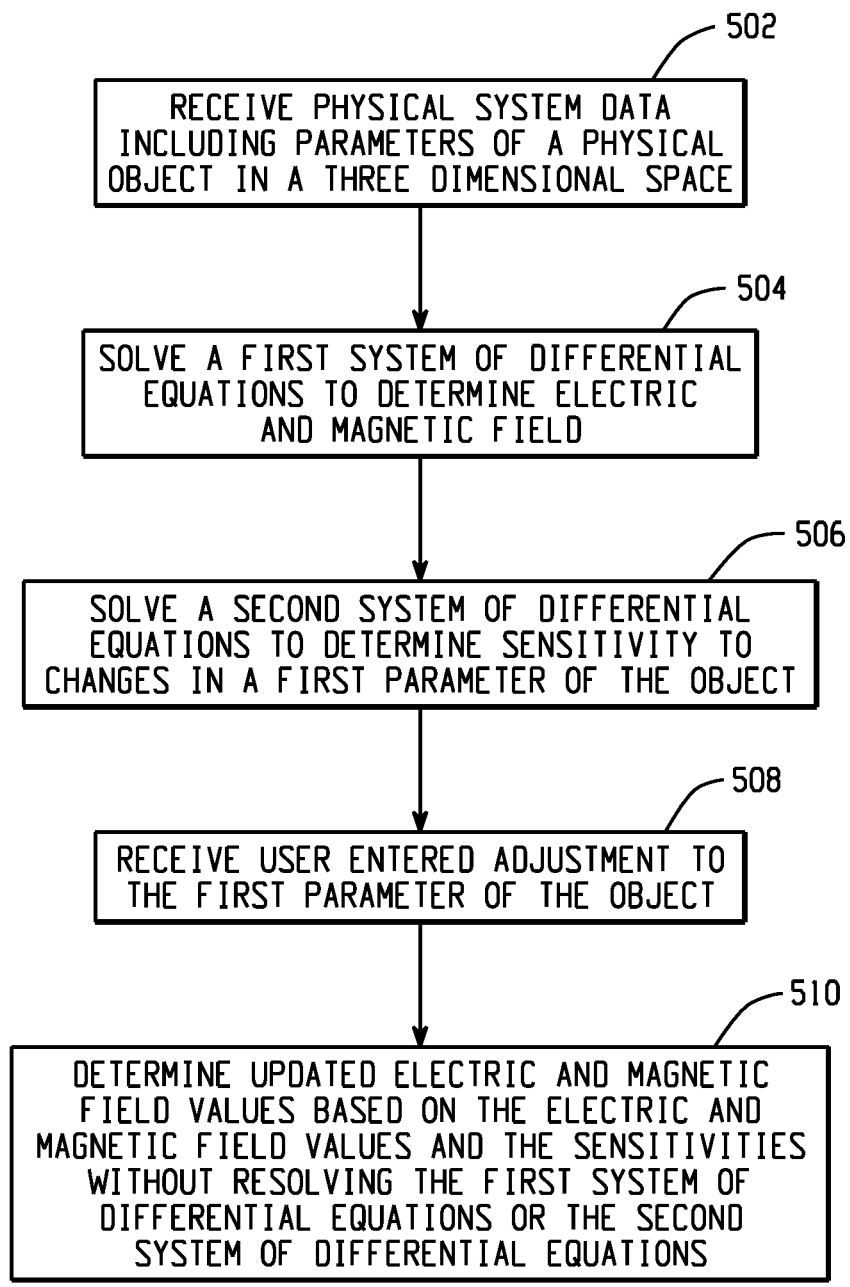
FIG. 5 is a flow diagram depicting a processor-implemented method for providing adjustable simulation of electric and magnetic fields of a physical system.

FIG. 5 is a flow diagram depicting a processor-implemented method for providing adjustable simulation of electric and magnetic fields of a physical system. Physical system data is received at 502 that is indicative of the presence of an object at locations in a three dimensional space, where the physical system data includes one or more parameters of the object, where the physical system data is stored in a computational mesh that represents the three dimensional space, the computational mesh being stored in a data structure in a non-transitory computer-readable medium. A first system of differential equations is solved at 504 to determine electric and magnetic field values at a plurality of points of the three dimensional space, and electric and magnetic field values are stored in the computational mesh data structure. A second system of differential equations is solved at 506 to determine sensitivities of the determined electric and magnetic fields to changes in a first parameter of the object at points in the three dimensional space. A user entered adjustment to the first parameter of the object is received at 508, and updated electric and magnetic field values are determined based on user entered adjustment, the electric and magnetic field values in the computational mesh, and the sensitivities without re-solving the first or second systems of differential equations at 510.

This application uses examples to illustrate the invention. The patentable scope of the invention includes other examples. For example, a similar method could be used to produce the tuned fields but instead using a different way of obtaining the derivative fields, such as:

1. Compute the derivatives of $\vec{E}$ and $\vec{H}$ on the mesh, or on surface, S, using numerical differentiation such as central differences.
2. For the transformed fields, the derivatives of $\vec{rE}$ and $\vec{rH}$ could be obtained using numerical differentiation of the transformed fields.
3. A system could change to the tuning of derived scalar quantities by using explicit differentiation to obtain a linear model. For example, the system could use equation (4) instead of (3) to compute the tuned magnitude of the electric fields.

As a further example, a system could fit the fields to some functions of the design variables for evaluation of the fields over a range of the design variables. This approach is more general and would provide accurate answers. As another example, the differentiation of the fields on the mesh in the examples described above utilizes a method which uses analytic differentiation of the system matrix. The derivative of the system matrix could be obtained using central differences or other alternate ways, such as via numerical differentiation methods.

It is claimed:

1. A processor-implemented method for providing adjustable simulation of electric and magnetic fields of a physical system, comprising:
    receiving physical system data indicative of the presence of an object at locations in a three dimensional space, wherein the physical system data includes one or more parameters of an antenna and electromagnetic source data corresponding to the object, wherein the physical system data is stored in a computational mesh that represents the three dimensional space, the computational mesh being stored in a data structure in a non-transitory computer-readable medium;
    solving a first system of differential equations to determine electric and magnetic field values at a plurality of points of the three dimensional space and storing electric and magnetic field values in the computational mesh data structure;
    solving a second system of differential equations to determine sensitivities of the determined electric and magnetic fields to changes in a first parameter of the antenna at points in the three dimensional space;
    receiving a user entered adjustment to the first parameter of the antenna;
    determining updated electric and magnetic field values based on user entered adjustment, the electric and magnetic field values in the computational mesh, and the sensitivities without re-solving the first system of differential equations or the second system of differential equations;
    wherein the antenna or a design of the antenna is modified based on the updated electric and magnetic field values.

2. The method of claim 1, further comprising:
    providing a display based on the stored electric and magnetic field values prior to receiving the user entered adjustment;
    providing an updated display based on the updated electric and magnetic field values that indicates a change in the electric and magnetic field values based on the user entered adjustment.

3. The method of claim 2, wherein the display is a two dimensional display that indicates electric or magnetic field values at points in a plane that intersects the three dimensional space.

4. The method of claim 2, wherein the display is a two dimensional display that depicts a tuned radiation pattern.

5. The method of claim 2, wherein the display is a three dimensional display that indicates data values at points on a three dimensional surface.

6. The method of claim 5, wherein the three dimensional display depicts surface currents at the points on the three dimensional surface.

7. The method of claim 1, wherein the updated electric field values are determined by computing:

$$\vec{E}(g_0 + \Delta g) \cong \vec{E}(g_0) + \Delta g \frac{\partial \vec{E}}{\partial g}(g_0),$$

where $\vec{E}(g_0+\Delta g)$ is the electric field based on the user entered adjustment to the first parameter, g is the first parameter, $g_0$ is the nominal value for the first parameter used in solving the first system of differential equations, $\Delta g$ is the user entered adjustment to the first parameter, and $$\frac{\partial \vec{E}}{\partial g}$$

is based on the solving of the second system of differential equations.

8. The method of claim 7, further comprising:
    computing equivalent surface currents $\vec{J}$ and $\vec{M}$ based on $\vec{E}$ and $\vec{H}$ and partial derivatives of $\vec{J}$ and $\vec{M}$ based on partial derivatives of $\vec{E}$ and $\vec{H}$;
    computing radiated fields $\vec{rE}$ and $\vec{rH}$ based on $\vec{J}$ and $\vec{M}$ and partial derivatives of $\vec{rE}$ and $\vec{rH}$ based on partial derivatives of $\vec{J}$ and $\vec{M}$;

determining an effect of a perturbation $\Delta g$ on the radiated field $\vec{rE}$ based on the partial derivative of $\vec{rE}$; and
determining an effect of a perturbation of $\Delta g$ on the radiated field $\vec{rH}$ based on the partial derivative of $\vec{rH}$.

9. The method of claim 1, wherein the updated magnetic field values are determined by computing:

$$\vec{H}(g_0 + \Delta g) \cong \vec{H}(g_0) + \Delta g \frac{\partial \vec{H}}{\partial g}(g_0),$$

where $\vec{H}(g_0 + \Delta g)$ is the magnetic field based on the user entered adjustment to the first parameter, g is the first parameter, $g_0$ is the nominal value for the first parameter used in solving the first system of differential equations, $\Delta g$ is the user entered adjustment to the first parameter, and $$\frac{\partial \vec{H}}{\partial g}$$

is based on the solving of the second system of differential equations.

10. The method of claim 1, wherein the second system of differential equations are solved using analytic differentiation of a system matrix and right-hand sides.

11. The method of claim 1, wherein the second system of differential equations are solved using a central differences numerical differentiation algorithm of a system matrix and right-hand sides.

12. The method of claim 1, wherein the first parameter is selected from the group comprising: a material present in the antenna, a thickness of a segment of the antenna, a width of the segment of the antenna, a size of the antenna, a position of a feed of the antenna, or a location of a component of the antenna.

13. The method of claim 1, wherein the user entered adjustment is within 10% of a nominal value for the first parameter.

14. The method of claim 1, wherein the user entered adjustment is received via a slide bar user interface control, the slide bar user interface control permitting iterative adjustments to the first parameter, a display being updated based on iterative adjustments.

15. The method of claim 1, further comprising:
solving a third system of differential equations to determine sensitivities of the determined electric and magnetic fields to changes in a second parameter of the antenna to change at points in the three dimensional space;
receiving a user entered adjustment to the second parameter of the antenna;
determining updated electric and magnetic field values based on user entered adjustment to the first parameter, the user entered adjustment to the second parameter, the electric and magnetic field values in the computational mesh, the sensitivities to changes in the first parameter, and the sensitivities to changes in the second parameter without re-solving the first system of differential equations, the second set of differential equations, or the third set of differential equations.

16. The method of claim 1, further comprising:
solving a $(n+1)^{th}$ system of differential equations to determine sensitivities of the determined electric and magnetic fields to changes in an $n^{th}$ parameter of the antenna to change at points in the three dimensional space;
receiving a user entered adjustment to the $n^{th}$ parameter of the antenna;
determining updated electric and magnetic field values based on user entered adjustment to the first parameter, the user entered adjustment to the $n^{th}$ parameter, the electric and magnetic field values in the computational mesh, the sensitivities to changes in the first parameter, and the sensitivities to changes in the $n^{th}$ parameter without re-solving any of the (n+1) differential equations.

17. The method of claim 1, wherein the antenna is part of a mobile hand-held device.

18. A computer-implemented system for providing adjustable simulation of electric and magnetic fields of a computer-system, comprising:
one or more data processors;
a non-transitory computer-readable medium encoded with:
a computational mesh data structure, wherein the computational mesh data structure is configured to contain data indicative of the presence of an object at locations in a three dimensional space and solved electric and magnetic field values corresponding to the object and measured by an antenna at a plurality of points in the three dimensional space;
instructions for commanding the one or more data processors to execute steps comprising:
solving a first system of differential equations to determine electric and magnetic values at a plurality of points of the three dimensional space and to store the electric and magnetic field values in the computational mesh data structure;
solving a second system of differential equations to determine sensitivities of the determined electric and magnetic fields to changes in a first parameter of the object antenna at points in the three dimensional space;
receiving a user entered adjustment to the first parameter of the antenna; and
determining updated electric and magnetic field values based on a user entered adjustment to the first parameter, the electric and magnetic field values in the computational mesh, and the sensitivities without re-solving the first system of differential equations or the second system of differential equations,
wherein the antenna or a design of the antenna is modified based on the updated electric and magnetic field values.

19. The system of claim 18, wherein the steps further comprise:
providing a display based on the stored electric and magnetic field values prior to receiving the user entered adjustment;
providing an updated display based on the updated electric and magnetic field values that indicates a change in the electric and magnetic field values based on the user entered adjustment.

20. The system of claim 19, wherein the display is a two dimensional display that indicates electric or magnetic field values at points in a plane that intersects the three dimensional space.

21. The system of claim 19, wherein the display is a two dimensional display that depicts a tuned radiation pattern.

22. The system of claim 18, wherein the updated electric field values are determined by computing:

$$\vec{E}(g_0 + \Delta g) \cong \vec{E}(g_0) + \Delta g \frac{\partial \vec{E}}{\partial g}(g_0),$$

where $\vec{E}(g_0+\Delta g)$ is the electric field based on the user entered adjustment to the first parameter, g is the first parameter, $g_0$ is the nominal value for the first parameter used in solving the first system of differential equations, $\Delta g$ is the user entered adjustment to the first parameter, and $$\frac{\partial \vec{E}}{\partial g}$$

is based on the solving of the second system of differential equations;

wherein the updated magnetic field values are determined by computing:

$$\vec{H}(g_0 + \Delta g) \cong \vec{H}(g_0) + \Delta g \frac{\partial \vec{H}}{\partial g}(g_0),$$

where $\vec{H}(g_0+\Delta g)$ is the magnetic field based on the user entered adjustment to the first parameter, g is the first parameter, $g_0$ is the nominal value for the first parameter used in solving the first system of differential equations, $\Delta g$ is the user entered adjustment to the first parameter, and $$\frac{\partial \vec{H}}{\partial g}$$

is based on the solving of the second system of differential equations.

23. A non-transitory computer-readable medium encoded with instructions for commanding one or more data processors to execute steps of a method for providing adjustable simulation of electric and magnetic fields of a physical system, the method comprising:

receiving physical system data indicative of the presence of an object at locations in a three dimensional space, wherein the physical system data includes one or more parameters of an antenna and electromagnetic source data corresponding to the object, wherein the physical system data is stored in a computational mesh that represents the three dimensional space, the computational mesh being stored in a data structure in a non-transitory computer-readable medium;

solving a first system of differential equations to determine electric and magnetic field values at a plurality of points of the three dimensional space and storing electric and magnetic field values in the computational mesh data structure;

solving a second system of differential equations to determine sensitivities of the determined electric and magnetic fields to changes in a first parameter of the object antenna at points in the three dimensional space; and receiving a user entered adjustment to the first parameter of the object antenna;

determining updated electric and magnetic field values based on the user entered adjustment, the electric and magnetic field values in the computational mesh, and the sensitivities without re-solving the first system of differential equations or the second system of differential equations, wherein the antenna or a design of the antenna is modified based on the updated electric and magnetic field values.

* * * * *